United States Patent
Gao et al.

(10) Patent No.: US 11,225,581 B2
(45) Date of Patent: Jan. 18, 2022

(54) CARBON NANOTUBE ALIGNED FILM AS WELL AS PREPARATION METHOD AND APPLICATION THEREOF

(71) Applicant: SUZHOU INSTITUTE OF NANO-TECH AND NANO-BIONICS (SINANO), CHINESE ACADEMY OF SCIENCES, Suzhou (CN)

(72) Inventors: Bing Gao, Suzhou (CN); Song Qiu, Suzhou (CN); Hehua Jin, Suzhou (CN); Qingwen Li, Suzhou (CN)

(73) Assignee: SUZHOU INSTITUTE OF NANO-TECH AND NANO-BIONICS (SINANO), CHINESE ACADEMY OF SCIENCES, Suzhou (CN)

( * ) Notice: Subject to any disclaimer, the term of this patent is extended or adjusted under 35 U.S.C. 154(b) by 0 days.

(21) Appl. No.: 17/271,603

(22) PCT Filed: Oct. 16, 2018

(86) PCT No.: PCT/CN2018/110464
§ 371 (c)(1),
(2) Date: Feb. 26, 2021

(87) PCT Pub. No.: WO2020/051970
PCT Pub. Date: Mar. 19, 2020

(65) Prior Publication Data
US 2021/0309867 A1    Oct. 7, 2021

(30) Foreign Application Priority Data
Sep. 14, 2018 (CN) .......................... 201811073606.2

(51) Int. Cl.
| | | |
|---|---|---|
| C09D 5/24 | (2006.01) | |
| C01B 32/159 | (2017.01) | |
| C01B 32/174 | (2017.01) | |
| C01B 32/16 | (2017.01) | |
| C09D 7/65 | (2018.01) | |
| C09D 7/20 | (2018.01) | |
| C09D 7/45 | (2018.01) | |
| C09D 7/63 | (2018.01) | |
| C09D 1/00 | (2006.01) | |
| H01L 51/00 | (2006.01) | |

(52) U.S. Cl.
CPC .............. *C09D 5/24* (2013.01); *C01B 32/159* (2017.08); *C01B 32/16* (2017.08); *C01B 32/174* (2017.08); *C09D 1/00* (2013.01); *C09D 7/20* (2018.01); *C09D 7/45* (2018.01); *C09D 7/63* (2018.01); *C09D 7/65* (2018.01); *H01L 51/0048* (2013.01); *C01B 2202/02* (2013.01); *C01B 2202/08* (2013.01); *C01B 2202/22* (2013.01); *C01B 2202/34* (2013.01)

(58) Field of Classification Search
CPC ... C09D 5/24; C09D 1/00; C09D 7/20; C09D 7/63; C09D 7/45; C09D 7/65; C01B 32/174; C01B 32/159; C01B 32/16; C01B 2202/02; C01B 2202/34; C01B 2202/22; C01B 2202/08; H01L 51/0048
USPC ................................. 428/206; 252/510, 511
See application file for complete search history.

(56) References Cited

U.S. PATENT DOCUMENTS

| | | | | |
|---|---|---|---|---|
| 8,110,026 | B2 * | 2/2012 | Prud'Homme | ....... C01B 32/225 96/4 |
| 9,786,853 | B2 * | 10/2017 | Arnold | ................ H01L 51/0558 |
| 9,938,149 | B1 * | 4/2018 | Gopalan | ............. H01L 51/0039 |
| 10,090,076 | B2 * | 10/2018 | Knaapila | .................... C09J 9/02 |
| 2003/0077515 | A1 * | 4/2003 | Chen | ...................... H01M 4/364 429/231.8 |
| 2010/0096597 | A1 * | 4/2010 | Prud'Homme | ....... C01B 32/192 252/511 |
| 2010/0104652 | A1 | 4/2010 | Biris et al. | |
| 2010/0247381 | A1 * | 9/2010 | Yodh | ..................... G01N 33/551 422/68.1 |
| 2015/0228897 | A1 * | 8/2015 | Arnold | ................... C01B 32/166 257/9 |
| 2018/0264416 | A1 * | 9/2018 | Li | ........................... B01D 71/66 |

(Continued)

FOREIGN PATENT DOCUMENTS

| | | |
|---|---|---|
| CN | 101591219 B | 8/2012 |
| CN | 101578237 B | 4/2013 |
| CN | 103112840 B | 4/2015 |
| CN | 104576744 A | 4/2015 |
| CN | 102695557 B | 10/2015 |
| CN | 105645387 A | 6/2016 |
| CN | 105819425 A | 8/2016 |
| CN | 105883749 A | 8/2016 |
| CN | 106061894 A | 10/2016 |
| CN | 106478927 A | 3/2017 |

(Continued)

*Primary Examiner* — Douglas J McGinty
(74) *Attorney, Agent, or Firm* — Bayramoglu Law Offices LLC (57) ABSTRACT

A carbon nanotube aligned film as well as a preparation method and application thereof are disclosed. The preparation method includes: providing a carbon nanotube dispersion solution comprising a selected carbon nanotube, a polymer as a carbon nanotube dispersing agent and binding to the selected carbon nanotube, an aromatic molecule binding to the selected carbon nanotube and allowing the surface of the selected carbon nanotube to have the same charges and an organic solvent being at least used for cooperating with the rest components of the dispersion solution to form uniform dispersion solution; and introducing a water phase layer to the upper surface of the dispersion solution to form a double-layer liquid phase system, partially or completely inserting a base into the double-layer liquid system, and then pulling out the base so as to form the carbon nanotube aligned film on the surface of the base.

17 Claims, 4 Drawing Sheets

(56) References Cited

U.S. PATENT DOCUMENTS

2021/0032109 A1\* 2/2021 Li .............................. C02F 1/44

FOREIGN PATENT DOCUMENTS

| CN | 106823983 A | 6/2017 |
|---|---|---|
| CN | 107298436 A | 10/2017 |
| CN | 107456918 A | 12/2017 |
| CN | 105585000 B | 1/2018 |
| CN | 107963610 A | 4/2018 |
| CN | 105611986 B | 5/2018 |
| CN | 105642184 B | 5/2018 |
| CN | 108017049 A | 5/2018 |
| CN | 105645388 B | 8/2018 |
| CN | 108490120 A | 9/2018 |
| JP | 2000044216 A | 2/2000 |
| JP | 2005162877 A | 6/2005 |
| JP | 2008024522 A | 2/2008 |
| WO | 2008139839 A1 | 11/2008 |

\* cited by examiner

CARBON NANOTUBE ALIGNED FILM AS WELL AS PREPARATION METHOD AND APPLICATION THEREOF

CROSS REFERENCE TO THE RELATED APPLICATIONS

This application is the national phase entry of International Application No. PCT/CN2018/110464, filed on Oct. 16, 2018, which is based upon and claims priority to Chinese Patent Application No. 201811073606.2, filed on Sep. 14, 2018, the entire contents of which are incorporated herein by reference.

TECHNICAL FIELD

The present application relates to a nano carbon material, particularly to a carbon nanotube aligned film as well as a preparation method and application thereof, belonging to the technical field of carbon nano materials.

BACKGROUND

Carbon nanotubes (CNTs) have attracted much attentions from people due to their excellent mechanical property, optical property, electrical property and other properties, and are preliminarily applied in the fields of photoelectric devices, electronic devices, mechanical materials, conductive materials, composite materials and the like. However, CNTs are tubular nano materials and have extremely large aspect ratios and specific surface areas. Meanwhile, there is a strong Van der Waal's force between CNTs so that CNTs are extremely easy to twine and agglomerate, and therefore CNTs are difficultly dispersed into a base and then the performances of the product are seriously restricted. Thus, if excellent performances of CNTs are exerted, it is urgent to solve a crucial problem of how to uniformly and stably disperse CNTs.

In recent years, to promote the dispersity of CNTs in an organic solvent and other a dispersion media, researchers propose many solutions that can be classified as a chemical modification method and a physical adsorption method. Among them, the chemical modification method is that a strong acid is used as an oxidizing agent, an oxygenic functional group is formed on the tube wall or tail end of CNTs, CNTs are short cut into short CNTs of hundreds of meters, the functionalized CNTs can be effectively dispersed in aqueous solution and different organic solvents, a long-chain organic molecule is grafted utilizing a covalent bond so as to promote dispersity between CNTs, but the $sp^2$ structure and length of CNTs are destroyed in the process of surface modification, so as to lead to reduction in original property of CNTs, which is disadvantageous to application effect. However, the physical adsorption method is referred to as a non-covalent modification method in which an interface activator is used as the dispersing agent or a macromolecule (for example conjugated polymer) having a specific molecular structure binds to the surfaces of CNTs, thereby achieving the stable dispersion of carbon nanotubes in the dispersion medium. Although the physical adsorption method can overcome some defects of the chemical modification method, most of the macromolecules used by the physical adsorption method are electrically neutral molecules without charges, mono-dispersed CNTs have no repulsive force action, and easy to twine and overlap due to Van Der Waal's force. In the process of alignment induction under the action of an external force, electrically neutral CNTs are easy to twine and closely pack due to Van Der Waal's force during the rearrangement and densification, which is disadvantageous to alignment of CNTs. However, in order to realize a high-performance integrated circuit of a large-scale field effect transistor, it is urgent to solve a crucial problem of how to control the alignment of the carbon nanotube film to reduce performance difference between devices in preparation of film devices.

SUMMARY

The main objective of the present application is to provide a carbon nanotube aligned film as well as a preparation method and application thereof, thereby overcoming the defects in the prior art.

In order to achieve the above-mentioned objective, the technical solution of the present application is as follows:

An embodiment of the present application provides a carbon nanotube dispersion solution, comprising:

a selected carbon nanotube;

a polymer as a carbon nanotube dispersing agent, binding to the selected carbon nanotube;

an aromatic molecule binding to the selected carbon nanotube and allowing the surface of the selected carbon nanotube to have the same charges; and an organic solvent being at least used for cooperating with the rest components of the dispersion solution to form uniform dispersion solution.

An embodiment of the present application also provides a preparation method of the above-mentioned carbon nanotube dispersion solution, comprising:

at least mixing a carbon nanotube powder raw material, a polymer as a carbon nanotube dispersing agent and a solvent to form a first dispersion solution and specifically binding the polymer to the selected carbon nanotube, and then separating the carbon nanotube whose surface binds to the polymer from the first dispersion solution;

at least mixing the carbon nanotube whose surface binds to the polymer, an aromatic molecule and a solvent to form a second dispersion solution and binding the aromatic molecule to the selected carbon nanotube and allowing the surface of the selected carbon nanotube to have the same charges, and then separating the carbon nanotube whose surface binds to the polymer and the aromatic molecule from the second dispersion solution; and dispersing the carbon nanotube whose surface binds to the polymer and the aromatic molecule into an organic solvent to form the carbon nanotube dispersion solution.

An embodiment of the present application also provides a powder material, comprising:

a selected carbon nanotube;

a polymer as a carbon nanotube dispersing agent, specifically binding to the selected carbon nanotube; and an aromatic molecule binding to the selected carbon nanotube and allowing the surface of the selected carbon nanotube to have the same charges.

An embodiment of the present application also provides a preparation method of a carbon nanotube aligned film, comprising:

providing any one of the above carbon nanotube dispersion solution, wherein the carbon nanotube dispersion solution is immiscible with water;

taking the carbon nanotube dispersion solution as an organic phase, introducing a water phase layer on the organic phase to form a double-layer liquid phase system composed of the water phase layer and the organic phase layer; and partially or completely inserting a base into the double-layer liquid phase system, and then pulling out the base from the double-layer liquid phase system, so as to form the carbon nanotube aligned film on the surface of the base.

Further, in the double-layer liquid phase system, an interface line between the water phase layer and the organic phase layer is close to a straight line.

An embodiment of the present application also provides the carbon nanotube aligned film prepared by the above-mentioned method.

Further, the film is a continuously and uniformly aligned carbon nanotube film.

An embodiment of the present application also provides use of the above-mentioned carbon nanotube aligned film in preparation of electronic devices, photoelectric devices, sensor devices or the like.

An embodiment of the present application also provides an apparatus, comprising the above-mentioned carbon nanotube aligned film.

Compared with the prior art, the present application at least has the following beneficial effects:

1) the preparation method of the carbon nanotube aligned film provided by the present application is to introduce the electrostatic repulsive force between tubes by adsorbing charged aromatic molecules on the surface of the conjugated polymer molecule dispersed high-pure carbon nanotube molecule to resist close packing and twining phenomena brought by densification and rearrangement in the process of inducing alignment by the external force;

2) the present application utilizes a double-liquid layer impregnation pulling method to perform alignment on the above high-pure carbon nanotubes, the water phase layer plays a certain liquid seal role in the organic phase on the lower layer, slows down the volatilization speed of the organic phase so as to prolong the self-assembling time of the carbon nanotubes in a meniscus at an air-organic phase interface and achieves the rearrangement and ordered arrangement of the carbon nanotubes at the air-organic phase interface line, thereby obtaining the carbon nanotube aligned film that is in consistency arrangement along the pulling direction;

3) the preparation method of the present application is not only simple and efficient, but also is easily used for scale-up preparation of the large-area alignment carbon nanotube film, and provides a firm material safeguard for application of the carbon nanotube films in the field of electronic devices.

BRIEF DESCRIPTION OF THE DRAWINGS

For more clearly illustrating the embodiments of the present application or the technical solution in the prior art, drawings required to be used in description of embodiments or the prior art will be simply described, obviously, the drawings in the following description are only some embodiments of the present application. For ordinary of skill in the art, other drawings can also be obtained according to these drawings without creative efforts.

DETAILED DESCRIPTION OF THE EMBODIMENTS

As described above, in view of the defects in the prior art, the inventor of this case proposes the technical solution of the present application via long-term research and lots of practices. Next, the technical solution of the present application will be clearly and completely described, obviously, the described embodiments are only a part of embodiments in the present application but not all the embodiments. Based on the embodiments in the present application, other embodiments obtained by ordinary of skill in the art without creative efforts are all included within the scope of protection of the present application.

One aspect of the embodiment of the present application provides a dispersion solution of a carbon nanotube, comprising:

a selected carbon nanotube;

a polymer as a carbon nanotube dispersing agent, specifically binding to the selected carbon nanotube;

an aromatic molecule binding to the selected carbon nanotube and allowing the surface of the carbon nanotube to have the same charges; and an organic solvent being at least used for cooperating with the dispersion solution to form a uniform dispersion solution.

In the present application, the "selected carbon nanotube" corresponds to the "polymer", for example polyvinylpyrrolidone, high-branched polymers and aniline oligomers. The "selected carbon nanotube" can be a single-walled carbon nanotube, a few-walled carbon nanotube, a multi-walled carbon nanotube and the like. For example again, for conjugated homopolymers or homopolymers based on carbazolyl, fluorenyl and thienyl, and the "selected carbon nanotube" can be a semiconductor type single-walled carbon nanotube.

In the present application, the polymer can be used as the carbon nanotube dispersing agent to separate at least a part of a plurality of carbon nanotubes into their individual sizes (0.4-100 nm in diameter), and stably disperse them into a dispersion medium such as an organic solvent in the state of "isolated dispersion" (without condensation). The "isolated dispersion" in the present application refers to a state that carbon nanotubes do not become a bulk form, a sarciniform and a rope form due to mutual cohesive force, which are dispersed into the dispersion medium in isolation one by one.

In the present application, different polymers can be respectively selected as dispersing agents of different types of carbon nanotubes.

For example, for single-walled carbon nanotubes, double-walled carbon nanotubes and multi-walled carbon nanotubes, polyvinylpyrrolidone, highly branched polymers having a triarylamine structure as a branching point, ananiline oligomers and derivatives thereof can be used as corresponding carbon nanotube dispersing agents. Specifically, please refer to documents such as JP200044216A, JP2005162877A, JP200824522A, WO2008/139839A, CN102695557B, CN101578237B, CN105645388B, CN105645387A, CN105642184B and CN106061894A.

Especially for semiconductor type carbon nanotubes, suitable polymers as carbon nanotube dispersing agents can be conjugated homopolymers or homopolymers based on carbazolyl, fluorenyl and thienyl, such as polythiophene derivatives, polyfluorene and/or polyfluorene derivatives and poly (m-phenylacetylene) derivatives, and polymers with other structures, such as tree-shaped conjugated polymers. More specifically, polycarbazole, polyfluorene, polythiophene, carbazole linear copolymers (PCz) and the like are especially suitably used as dispersing agents for semiconductor type single-walled carbon nanotubes.

These polymers can specifically bind to semiconductor type single-walled carbon nanotubes through physical action such as π-π interaction, and promote the stable "isolated dispersion" of semiconductor type single-walled carbon nanotubes in organic solvents and other dispersion media. More further, for selection of these polymers, please refer to CN103112840B, CN105585000B, CN107456918A, CN106823983A, CN106478927A, CN105611986B, etc.

In the present application, the aromatic molecule can bind to the carbon nanotube whose surface specifically binds to the polymer and allow the surfaces of various carbon nanotubes in the same dispersion system to have the same charges (positive charges or negative charges), thereby forming an electrostatic repulsive force between various carbon nanotubes to resist close packing and twining phenomena brought by densification and rearrangement in the process of inducing alignment by the external force.

In some embodiments of the present application, the selected carbon nanotube is the semiconductor type single-walled carbon nanotube, and the carbon nanotube dispersing agent adaptive to the carbon nanotube can be a conjugated polymer such as a conjugated homopolymer or homopolymer based on carbazyl, fluorenyl and thienyl, especially for example can be a homopolymer or copolymer selected from at least one of carbazole, polyfluorene, polythiophene, polyhenylene and the like, and the copolymerization unit of the copolymer comprises any one of benzene, thiophene, pyridine, triarylamine and benzothiadiazole or alkylated derivatives thereof or combinations thereof, and preferably is selected from carbazole linear copolymer (PCz) and the like, but is not limited thereto.

In some embodiments of the present application, the aromatic molecule preferably has a condensed ring aromatic conjugated structure (which can interact with the semiconductor type single-walled carbon nanotube through π-π stacking interaction) and atoms or substituents (which are used for introducing electrostatic repulsive force between tubes in order to charge the surface of the semiconductor type single-walled carbon nanotube) with positive charges or negative charges.

Further, the structural formula of the aromatic molecule comprises at least one of formula (I)-formula (V):

a)

Formula (I)

Formula (II)

2.

Formula (III)

2)

Formula (IV)

3)

Formula (V)

wherein, X comprises $SO_4^{2-}$, $SO_3^{2-}$, $CO_3^{2-}$, $NO_3^-$ or $Cl^-$, Y comprises Cl, and Z comprises $Na^+$ or $K^+$.

More further, the typical structure of the aromatic molecule can refer to any compound of the following formulas (1)-(6), but is not limited thereto.

1)
a)

Formula (1)

(Proflavine Hemisufate, PFS)

(B)
i.

Formula (2)

(Neutral Red, NR)

2)
3)

Formula (3)

(Acridine Orange, AO)

4)
5)

Formula (4)

(Alizarine Red AR)

6)
i.

Formula (5)

(Pryene+)

7)
1.

Formula (6)

(Orange G, OR)

In some embodiments of the present application, a dye aromatic small molecule with positive charges is used as a preferred embodiment, that is, Proflavine Hemisufate (PFS) molecule of formula (I).

The above-mentioned semiconductor type single-walled carbon nanotubes (s-SWCNTs) have unique structures and electronic features, such as over-length diameter ratios, large specific areas and adjustable band gaps, excellent electron and hole mobility (this carrier mobility is up to 70000 $cm^2V^{-1}s^{-1}$), is considered as one of the most promising materials that are used for preparing next-generation field effect films and radio frequency transistors. One-dimensional characteristic of a single s-SWCNTs makes it exhibit extremely significant anisotropy in the aspects of electrical, optical, mechanical, magnetic and other properties.

In the prior art, the s-SWCNTs solution obtained based on a solution method can be used for preparing large-area out-of-order network-like carbon nanotube films through different methods. However, the carbon nanotubes randomly distributed in the network-like carbon nanotube film have obvious twining and overlapping phenomena, the migration rate of the carriers is reduced to a great extent due to increase in contact resistor between tubes, which cannot exert the excellent performance of the single carbon nanotube and is disadvantageous to achievement of high-performance integrated circuits.

For how to control the structure of the carbon nanotube and effectively retain the excellent performance of the single carbon nanotube, currently, one of main solution ideas is to prepare a large-area aligned s-SWCNTs film. There are mainly two methods for achieving alignment of carbon nanotubes, one method is that an aligned array of carbon nanotubes is directly grown via chemical vapor deposition, and the other method is alignment of the carbon nanotubes pre-separated in the solution. A mixture of metal type and semiconductor type carbon nanotubes is obtained through the direct growth method, the existence of the metal type single-walled carbon nanotubes seriously affects the performances of carbon nanotube film transistor devices. Therefore, it is necessary to further optimize the purity of the directly grown semiconductor type carbon nanotubes. According to the specific physical and electronic structure of the single-walled carbon nanotube, researchers have developed a variety of methods for posttreatment and separation of semiconductor type carbon nanotubes in aqueous solution or organic solution. For details, please refer to literatures listed above. Furthermore, in order to make full use of the advantages of high-pure s-SWCNTs separated based on solution method in the application of semiconductor electronic devices, researchers have also developed methods for realizing the assembling and alignment of semiconductor type carbon nanotubes based on solution method, such as shearing force induction, evaporation driven self-assembling, spin coating, chemical self-assembling, vacuum filtration, electromagnetic field induction, a template method and an ink jet printing technology. For example, CN107963610A discloses that the precise control of positions, alignment density and patterning of the alignment carbon nanotube film is achieved by using ink jet printing on the functionalized hydrophobic base, and carbon nanotube films having uniform density, consistent alignment and different patterns are arranged. However, this method is only suitable for alignment of carbon nanotubes in a surfactant system, which cannot get rid of inherent defects of alignment technology of s-SWCNTs in the surfactant system. For example, on the one hand, the purity of s-SWCNTs dispersed by surfactants is not high enough; on the other hand, the surface of s-SWCNTs is coated with excessive residual surfactants, which seriously hinders the transfer of charges and significantly reduces the performance of the device. For another example, CN106061894A discloses that the s-SWCNTs film is deposited through the organic dispersion solution of s-SWCNTs dispersed by polyfluorene derivatives, The thin layer of the organic dispersion solution of s-SWCNTs spreads on the surface of the aqueous medium to induce evaporation self-assembling when contacting with the solid base. The high density film of the semiconductor type single-walled carbon nanotube with a certain degree of alignment is prepared by this method. As mentioned above, the polyfluorene derivatives used in this technology are electrically neutral molecules without charges, and the s-SWCNTs can be twined and overlapped with each other due to van Der Waal's force. In the process of inducing alignment under the action of external force, s-SWCNTs often inevitably generate twining and close packing phenomena in the process of rearrangement and densification, which is unfavorable for the alignment of s-SWCNTs. In addition, in the impregnation pulling method, the large-area uniform s-SWCNTs film can be obtained through rapid evaporation of the organic solvent in the process of pulling the base from the s-SWCNTs suspension, thereby realizing rapid and controllable preparation of high-quality, large-area and high-uniformity s-SWCNTs films. However, one common problem of these existing technologies is that alignment of s-SWCNTs cannot be well realized.

In some embodiments of the present application, a kind of charged aromatic molecules are adopted to be adsorbed to the surface of the separated high-pure semiconductor type single-walled carbon nanotube such as a conjugated polymer molecule in the organic system through $\pi$-$\pi$ stacking interaction so that the surface of the semiconductor type single-walled carbon nanotube is charged so as to introduce the electrostatic repulsive force between tubes, thereby obtaining the dispersion solution of the high-pure semiconductor type single-walled nanotube with trace repulsive force introduced between semiconductor type single-walled nanotubes and good stability. The introduced electrostatic repulsive force between tubes is used to resist the twining and close packing brought by the self-assembling process during the alignment, and then promote the efficient, uniform and large-area alignment of s-SWCNTs.

In some embodiments of the present application, a mass ratio of carbon nanotubes to the polymer in the dispersion solution is 1:0.001-1:100, preferably 1:0.01-1:50, particularly preferably 1:0.1-1:10.

In some embodiments of the present application, a mass ratio of carbon nanotubes to the aromatic molecules in the dispersion solution is 1:0.005-1:50, preferably 1:0.05-1:20, particularly preferably 1:0.1-1:10.

Further, the content of the carbon nanotubes in the dispersion solution is 0.5 µg/mL or more.

Further, the average length of the carbon nanotubes in the dispersion solution is 100-3000 nm.

Further, the organic solvent comprises a combination of any one or more than two of haloalkane, aromatic hydrocarbon, aryl halide and the like, but is not limited thereto.

More further, the haloalkane can be selected from a combination of any one or more than two of chloroform, dichloromethane, dichloroethane and the like, the aromatic hydrocarbon can be selected from toluene, xylene and the like, and the aryl halide can be selected from chlorobenzene, dichlorobenzene and the like but is not limited thereto.

Another aspect of the embodiment of the present application also provides a preparation method of the above-mentioned carbon nanotube dispersion solution, comprising:

at least mixing a carbon nanotube powder raw material, a polymer as a carbon nanotube dispersing agent and a solvent to form a first dispersion solution and specifically binding the polymer to the selected carbon nanotube, and then separating the carbon nanotube whose surface binds to the polymer from the first dispersion solution;

at least mixing the carbon nanotube whose surface binds to the polymer, an aromatic molecule and a solvent to form a second dispersion solution and specifically binding the aromatic molecule to the selected carbon nanotube and allowing the surface of the selected carbon nanotube to have the same charges, and then separating the carbon nanotube whose surface binds to the polymer and the aromatic molecule from the second dispersion solution; and dispersing the carbon nanotube whose surface binds to the polymer and the aromatic molecule into the organic solvent to form the carbon nanotube dispersion solution.

In some more specific embodiments, the preparation method can specifically comprises:

selectively dispersing a single-walled carbon nanotube powder raw material utilizing the conjugated polymer to obtain the dispersion solution of the semiconductor type single-walled carbon nanotube, filtering and washing the dispersion solution to remove the free conjugate polymer to obtain the semiconductor type single-walled carbon nanotube powder, namely first powder, whose surface contains residual conjugated polymer;

mixing the obtained first powder, the aromatic molecule and the organic solvent to form a dispersion solution, then filtering to remove the aromatic molecule which does not bind to the semiconductor type single-walled carbon nanotube to obtain second powder; and dispersing the second powder into the organic solvent to form the dispersion solution of the semiconductor type single-walled carbon nanotube.

Further, the single-walled carbon nanotube powder raw material is selected from original single-walled carbon nanotubes, and is prepared by an arc discharge method, a plasma discharge method, a laser ablation method or a chemical vapor deposition method but not limited thereto.

In some embodiments of the present application, the preparation method comprises: mixing and ultrasonically dispersing the conjugated polymer and the original single-walled carbon nanotube, and then filtering and washing to remove the conjugated polymer molecule coating on the surface of the semiconductor type single-walled carbon nanotube to obtain a semiconductor type single-walled carbon nanotube with the purity of 99.9% or more.

Further, the preparation method can comprise: selectively dispersing the semiconductor type single-walled carbon nanotube with the purity of 99.9% utilizing the conjugated polymer in the organic system, then filtering in vacuum and washing to obtain the semiconductor type single-walled carbon nanotube powder with a small amount of conjugated polymer remained on the surface and good monodispersity, further purifying the high-pure semiconductor type single-walled carbon nanotube while ensuring that the washed semiconductor type single-walled carbon nanotube can realize monodispersion again.

In some specific embodiments of the present application, a preparation method of a semiconductor type single-walled carbon nanotube dispersion solution can comprise the following steps:

1) Ultrasound and Centrifugation

According to a certain ratio, a certain mass of conjugated polymer and original single-walled carbon nanotubes are accurately weighed and mixed in a certain volume of xylene (or toluene) solvent, the polymer is ultrasonically and sufficiently dissolved in a water bath, then subjected to ultrasonic dispersion using an ultrasonic pulverizer. The dispersed carbon nanotube solution is pre-separated at a rotation low speed to obtain a supernatant, and then centrifuged at a high rotation speed to obtain a supernatant, namely, the xylene (or toluene) dispersion solution of the high-pure semiconductor type single-walled carbon nanotube whose surface is coated with excessive polymer molecules.

2) Vacuum Filtration and Washing with Organic Solvent:

the xylene (or toluene) dispersion solution of the high-pure semiconductor type single-walled carbon nanotube whose surface is coated with excessive polymer molecules obtained in step 1) is poured into a funnel for vacuum filtration. The separated high-pure semiconductor type single-walled carbon nanotube solid is left on a filter film, and then the filter film is washed with a large amount of organic solvents (tetrahydrofuran, chloroform, dichloromethane, etc.) to remove the excessive polymer molecules coating on the surface of the semiconductor type single-walled carbon nanotube to obtain the semiconductor type single-walled carbon nanotube solid powder (that is, the first powder) with a small amount of polymer molecules.

In some more preferred embodiments, the preparation method specifically can comprise: re-dispersing the above obtained semiconductor type single-walled carbon nanotube solid powder into the organic solution of condensed ring aromatic small molecules to obtain the organic dispersion solution of the high-pure semiconductor type single-walled carbon nanotube with electrostatic repulsive force introduced between tubes.

Further, the preparation method also comprises: filtering the chloroform dispersion solution of the high-pure semiconductor type single-walled carbon nanotubes with electrostatic repulsive force introduced between tubes in vacuum so that the semiconductor type single-walled carbon nanotube solid with the electrostatic repulsive force introduced on the surface is left on the filter film, then washing the filter film using a large amount of organic solvent to remove the free condensed ring aromatic small molecules until the filtrate has no absorption peak of this molecule and finally the high-pure semiconductor type single-walled carbon nanotube solid powder (that is, the second powder) with electrostatic repulsive force introduced between tubes and without free condensed ring aromatic molecules is obtained, and re-dispersing the solid powder into the organic solvent to obtain the dispersion solution of the high-pure semiconductor type single-walled carbon nanotube with electrostatic repulsive force introduced between tubes and without free condensed ring aromatic small molecules.

Another aspect of the embodiment of the present application also provides a powder material, comprising:

a selected carbon nanotube;

a polymer serving as a polymer of a carbon nanotube dispersing agent and specifically binding to the selected carbon nanotube; and an aromatic molecule binding to the selected carbon nanotube and allowing the surface of the selected carbon nanotube to have the same charges.

In some embodiments of the present application, the aromatic molecule preferably has a condensed ring aromatic conjugated structure (which is used for interacting with the semiconductor type single-walled carbon nanotube through π-π stacking interaction) and atoms or substituents (which is used for charging the surface of the semiconductor type single-walled carbon nanotube to introduce the electrostatic repulsive force between tubes) with positive charges or negative charges, the structural formula includes at least one of formula (I)-formula (V), and the typical structure can refer to any one compound of formula (1)-(6), but is not limited thereto.

In some embodiments of the present application, one of the dye aromatic small molecules with positive charges serves as a preferred embodiment, that is, a Proflavine Hemisufate (PFS) molecule of formula (1).

In the embodiment, the conjugated polymer is a conjugated homopolymer or homopolymer based on carbazolyl, fluorenyl and thienyl, such as a homopolymer or copolymer of at least one of polycarbazole, polyfluorene, polythiophene and polyphenylene ethylene, wherein the copolymerization unit of the copolymer is selected from any one of benzene, thiophene, pyridine, triarylamine and benzothiadiazole or alkylated derivatives thereof or a combination thereof. For example, the conjugated polymer is preferably selected from a carbazole linear copolymer (PCz), but is not limited to thereto.

In addition, in some embodiments, the conjugated polymer can also be replaced as a benzobenzene small molecule dispersing agent, please refer to CN107298436A.

In some embodiments of the present application, the mass ratio of carbon nanotubes to a polymer in the powder material is 1:0.001-1:100, preferably 1:0.01-1:50, particularly preferably 1:0.1-1:10.

In some embodiments of the present application, the mass ratio of carbon nanotubes to aromatic molecules in the powder material is 1:0.005-1:50, preferably 1:0.05-1:20, particularly preferably 1:0.1-1:10.

Further, the average length of the semiconductor type single-walled carbon nanotubes in the powder material is 100-3000 nm.

Another aspect of the embodiment of the present application also provides a preparation method of a semiconductor type single-walled carbon nanotube aligned film, comprising:

providing any one of the above carbon nanotube dispersion solution, wherein the carbon nanotube dispersion solution is immiscible with water;

taking the carbon nanotube dispersion solution as the organic phase and introducing an aqueous phase layer on the organic phase to form a double-layer liquid phase system composed of the water phase layer and the organic phase layer; and partially and completely inserting the base into the double-layer liquid phase system, and then pulling out the base from the double-layer liquid phase system to form the carbon nanotube aligned film on the surface of the base.

In some embodiments of the present application, the preparation method specifically comprises: disposing the water phase layer on the dispersion solution of the carbon nanotubes, and then pulling out the base from the dispersion solution of the carbon nanotube via a two-phase interface of the water phase layer and the organic phase layer using a double-liquid layer impregnation pulling method to obtain the carbon nanotube film, thereby obtaining the carbon nanotube aligned film being in consistency arrangement along the pulling direction. The water phase layer plays a liquid seal role in the organic phase on the lower layer, which can slow down the volatilization rate of the organic phase, prolong the self-assembling time of carbon nanotubes in the meniscus at the air-organic phase interface, and realize the rearrangement and ordered arrangement of carbon nanotubes at the air-organic phase interface line.

In the present application, the carbon nanotube aligned film is deposited by utilizing the organic phase where carbon nanotubes with electrostatic repulsive force between tubes are dissolved. The water phase layer with a certain thickness is added on the organic phase where carbon nanotubes with electrostatic repulsive force between tubes are dissolved, and the solid base is pulled out from the organic phase through the organic phase-water phase interface.

In some embodiments of the present application, the interface line between the water phase layer and the organic phase layer in the double-layer liquid phase system is close to a straight line.

In some embodiments of the present application, the preparation method comprises: inserting the base into the double-layer liquid phase system at a descent rate of 200-2000 μm/s (preferably 500-1500 μm/s, particularly preferably 800-1000 μm/s).

In some more preferred embodiments, the preparation method further comprises immersing most of the base into the dispersion solution of the carbon nanotubes.

In some embodiments of the present application, the preparation method can comprise: pulling out the base from the double-layer liquid phase system at an upward pulling speed. This process goes through the water-organic phase interface line and prolongs the self-assembling time of the semiconductor type single-walled carbon nanotube in the meniscus at the air-organic phase interface under the action of liquid seal applied by the water phase layer, so as to realize the rearrangement and ordered arrangement of the carbon nanotubes.

Further, the upward pulling speed of the base includes a slow pulling speed and a rapid pulling speed. In some preferred embodiments, the preparation method can comprise: pulling out the base from the double-layer liquid phase system at a pulling rate of 1-5000 μm/s, preferably 50-1000 μm/s, more preferably 200-500 μm/s.

Further, the water phase layer comprises pure water or aqueous solution. The aqueous solution can also comprise inorganic salts, organic solvents and the like, which are at least used for adjusting the viscosity and tension of the double-layer liquid phase system.

Further, the thickness of the water phase layer is 1-15 mm.

Further, the base has a hydrophobic surface. For example, the material of the base can be a rigid material, a flexible material and the like, the rigid material comprises silicon oxide wafer, quartz wafer, sapphire substrate and the like, and the flexible material comprises polyethylene naphthalate (PEN), polyethylene terephthalate (PET), polyimide (PI) and the like, but is not limited to thereto.

Another aspect of the embodiment of the present application also provides a carbon nanotube aligned film prepared by the above method.

In some embodiments, the film comprises a plurality of aligned carbon nanotubes, and is a continuously and uniformly aligned carbon nanotube film.

In some embodiments, the thickness of the film is 2-5 nm.

In some preferred embodiments, the edge region of the base surface is removed, and large-area continuously and uniformly aligned carbon nanotubes can be realized in the effective film-forming region of the base surface.

Further, the alignment direction of the carbon nanotubes is consistent with the pulling direction.

Another aspect of the embodiment of the present application also provides use of the above semiconductor type single-walled carbon nanotube aligned film in the fields of electronic devices, photoelectric devices, sensor devices and the like.

Another aspect of the embodiment of the present application also provides an apparatus, comprising the above semiconductor type single-walled carbon nanotube aligned film.

For example, the apparatus can be an electronic device such as a thin film transistor, a field effect transistor, a memory and an integrated circuit device, or a photoelectric device such as a photovoltaic device and a photodetector, or any one of sensor devices such as a chemical sensor and a biosensor, but is not limited to thereto.

In conclusion, the preparation method of the present application is not only simple and efficient, but also can effectively solve the problems existing in the prior art, such as carbon nanotube purity, twining and packing of carbon nanotubes in the process of inducing alignment by external force, and small effective carbon nanotube alignment area.

According to the above technical solution, the preparation method of the present application is not only simple and efficient, but also easy to scale up and prepare large-area continuous aligned carbon nanotube film, which provides a solid material guarantee for the application in the field of electronic devices based on carbon nanotube films.

The technical solution of the present application is described in more detail in combination with some more specific embodiments and the attached drawings.

Figure 1:
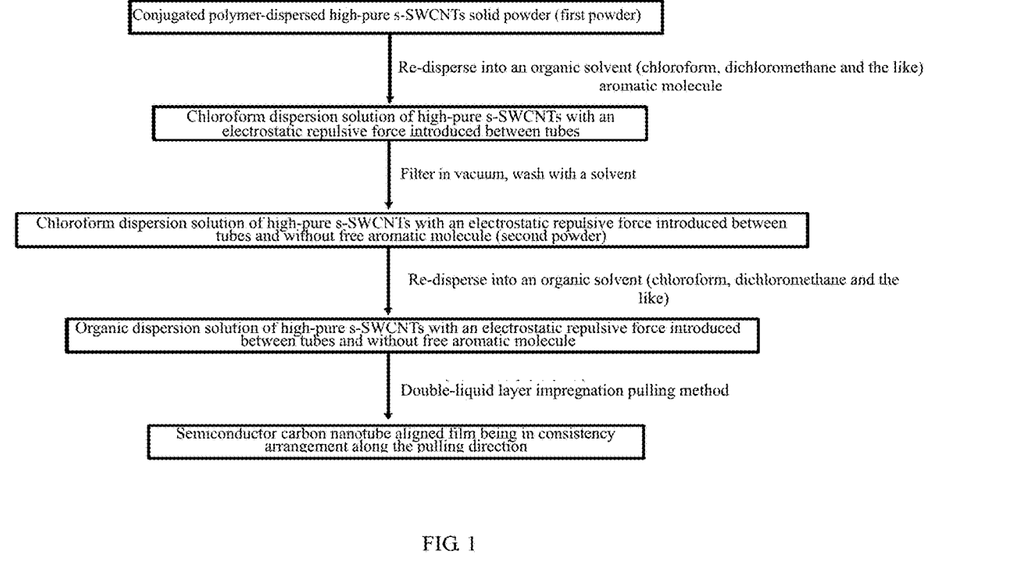
FIG. 1 is a flowchart of a preparation process of a high-pure semiconductor type single-walled carbon nanotube, which is used for introducing an electrostatic repulsive force between tubes and preparing a large-area continuous aligned carbon nanotube film according to a typical embodiment of the present application.

Some more specific embodiments of the present application relate to a preparation method of dispersion solution, powder and aligned film (hereinafter referred to as s-SWCNTs) of a semiconductor type single-walled carbon nanotube, as shown in FIG. 1, which can specifically comprises the following general steps:

1. Preparation Method of Semiconductor Type Single-Walled Carbon Nanotube Dispersion and Powder 1.1 Ultrasound and Centrifugation According to a certain ratio, a certain mass of conjugated polymer and original single-walled carbon nanotubes are accurately weighed and mixed in an organic solvent, and the polymer is sufficiently and ultrasonically dissolved in a water bath and then subjected to ultrasonic dispersion using an ultrasonic pulverizer. The dispersed carbon nanotube solution is pre-separated at a low rotation speed to obtain a supernatant, and then centrifuged at a high rotation speed to obtain a supernatant, namely, the dispersion solution of high-pure s-SWCNTs whose surface is coated with excessive polymer molecules, which is dispersed and extracted by the polymer.

1.2 Vacuum Filtration and Washing with Organic Solvent:

The dispersion solution of the s-SWCNTs whose surface is coated with excessive polymer molecules obtained in step 1) is poured into a funnel for vacuum filtration. The separated high-pure semiconductor type single-walled solid is left on a filter film, and then the filter film is washed with a large amount of solvents to remove excessive polymer molecules coating on the surface of the s-SWCNTs to obtain the s-SWCNTs solid powder (that is, the first powder) with a small amount of polymer molecules left on the surface.

1.3 Re-Dispersion into Organic Solution of Aromatic Molecule

The s-SWCNTs solid powder obtained in step 1.2 is re-dispersed into the organic solution of the aromatic molecule to obtain the high-pure s-SWCNTs dispersion solution with electrostatic repulsive force introduced between tubes.

1.4 Vacuum Filtration and Washing with Ethanol

After step 1.3 is completed, the high-pure s-SWCNTs dispersion solution with electrostatic repulsive force introduced between tubes is filtered in vacuum, the s-SWCNTs solid with electrostatic repulsive force introduced on the surface is left on the filter film, the filter film is washed with a large amount of solvent to remove the free aromatic molecules until the filtrate has no absorption peak of the aromatic molecule. Finally, the high-pure s-SWCNTs solid powder (i.e., second powder) with electrostatic repulsive force introduced between tubes and without free aromatic molecules is obtained.

1.5 Re-Dispersion into Chloroform

The s-SWCNTs solid powder obtained in step 1.4 is re-dispersed into the organic solvent to obtain the dispersion solution of the high-pure s-SWCNTs with electrostatic repulsive force introduced between tubes and without free aromatic molecules is obtained.

Figure 2:
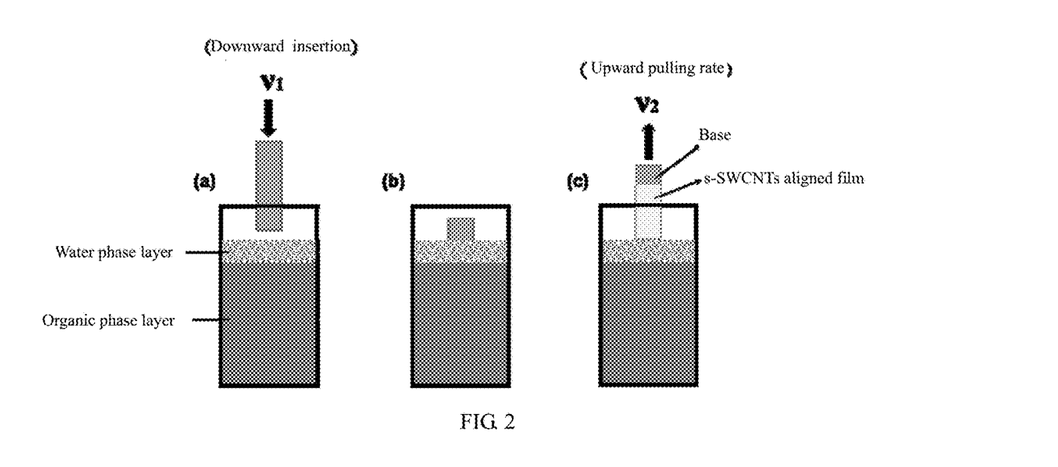
FIG. 2 is a process diagram of a double-liquid layer impregnation pulling method for preparing a large-area continuous aligned CNTs film according to a typical embodiment of the present application.

2. The preparation method of the semiconductor type single-walled carbon nanotube aligned film (double-liquid layer impregnation pulling alignment method (see FIG. 2)) especially comprises the following operation steps:

2.1 a certain volume of organic dispersion solution of s-SWCNTs obtained in step 1.5 is added into a square quartz colorimetric dish with organic corrosion resistance. Then a certain volume of deionized water is added on the upper layer of the dispersion solution to form a water phase layer having a certain thickness and meanwhile ensure that the two-phase interface line between the water phase layer and the organic layer is basically close to a straight line. Thus, a double-liquid layer with a stable liquid-liquid two-phase interface line is formed.

2.2 The hydrophobic base is inserted into the organic dispersion solution of s-SWCNTs via the water phase layer on the upper layer at a certain descent speed (namely $v_1$), and most of the hydrophobic base is immersed into the organic dispersion solution of s-SWCNTs.

2.3 The hydrophobic base is pulled out from the organic dispersion solution where the high-pure s-SWCNTs with repulsive force introduced between tubes are dissolved at a certain upward pulling speed (i.e., $v_2$). This process can go through the water-organic interface line and prolong the self-assembling time of s-SWCNTs in the meniscus at the air-organic phase interface under the action of liquid seal applied by the water phase layer, thereby realizing the rearrangement and ordered arrangement of s-SWCNTs.

Unless otherwise specified, the methods in the following examples are all conventional methods in the art.

Example 1

1) On the basis of general step 1.1, referring to CN108017049A, a feed ratio of a carbazole linear copolymer (PCz) to a single-walled carbon nanotube raw material (commercially available and made by an arc discharge method) was adjusted to 1:1 (mass ratio, if not specified), and toluene was used as a dispersing agent. The toluene dispersion solution of polymer-dispersed high-pure s-SWCNTs was obtained by ultrasonic dispersion and centrifugation.

2) The first powder was obtained by reference to general step 1.2.

3) The first powder obtained in step 2) was re-dispersed into chloroform solution of Proflavine Hemisufate (PFS) with a mass concentration of 0.02 mg/mL, and chloroform dispersion solution of high-pure s-SWCNTs with electrostatic repulsive force introduced between tubes was obtained.

4) The high-pure s-SWCNTs solid powder (i.e., second powder) with electrostatic repulsive force introduced between tubes and without free Proflavine Hemisufate (PFS) molecules was obtained by reference to general step 1.4.

5) The second powder obtained in step 4) was re-dispersed into a chloroform solvent to obtain chloroform dispersion solution of high-pure s-SWCNTs with electrostatic repulsive force introduced between tubes and without free Proflavine Hemisufate (PFS) molecules. Wherein, the content of s-SWCNTs was 0.5 µg/mL or more, and the average length of s-SWCNTs was 100-3000 nm, The mass ratio of s-SWCNTs to conjugated polymer was 1:0.001, and the mass ratio of s-SWCNTs to Proflavine Hemisufate (PFS) molecules was 1:0.005.

Figure 4A:
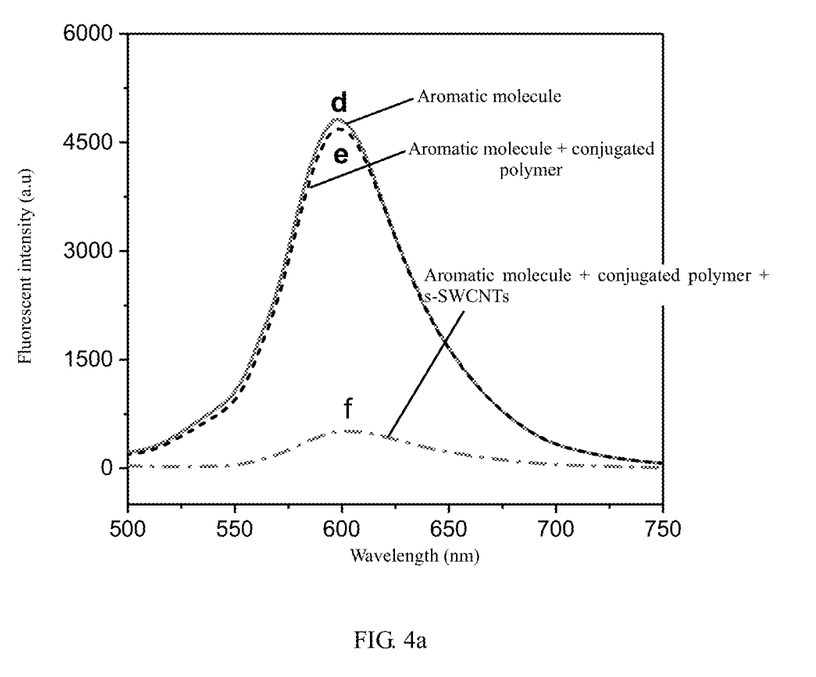
FIG. 4A is a diagram showing fluorescent curve change after different PFS aromatic molecules are adsorbed on the surface of a conjugated polymer dispersed high-pure semiconductor type single-walled carbon nanotube according to a typical embodiment 1 of the present application.

After Proflavine Hemisufate (PFS) molecule itself, as a fluorescent dye molecule, was adsorbed onto the surface of high-pure s-SWCNTs through π-π stacking, its fluorescence can be quenched by s-SWCNTs, and correspondingly the fluorescence intensity was significantly reduced, as shown in FIG. 4A.

Figure 4B:
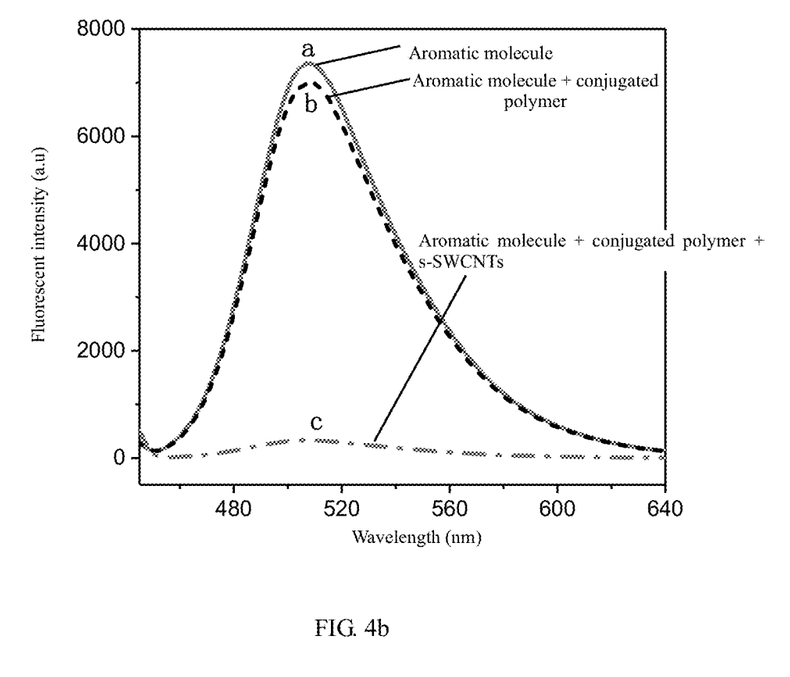
FIG. 4B is a diagram showing fluorescent curve change after different PFS aromatic molecules are adsorbed on the surface of a conjugated polymer dispersed high-pure semiconductor type single-walled carbon nanotube according to a typical embodiment 2 of the present application.

A small amount of conjugated polymer PCz molecules remained on the surface of s-SWCNts do not significantly affect the fluorescence intensity of aromatic molecules, as shown in FIGS. 4A and 4B.

6) Referring to general step 2, the concentration of chloroform dispersion solution used for pulling was 5 μg/mL. Then deionized water was added onto the upper layer of the dispersion solution to form a water phase layer with a thickness of 1 mm. The silicon oxide wafer was inserted into chloroform dispersion solution at a descent rate ($v_1$) of 1000 μm/s, and then pulled out at an upward pulling rate ($v_2$) of 200 μm/s.

Figure 3A:
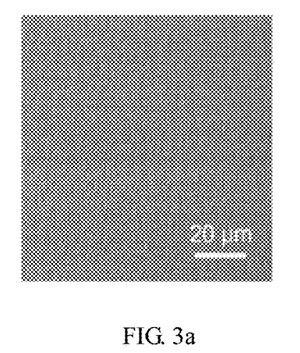
FIG. 3A is a SEM image of high-pure semiconductor type single-walled carbon nanotube aligned films obtained according to a typical embodiment 1 of the present application.

Through test, the SEM image of the semiconductor type single-walled carbon nanotube aligned film prepared in this example is shown in FIG. 3A, and the semiconductor type single-walled carbon nanotube presents large-area continuous alignment along the pulling direction of the base.

Example 2

1) On the basis of general step 1.1, referring to CN105819425A, a feed ratio of a carbazole derivative to a single-walled carbon nanotube raw material (commercially available and made by an arc discharge method) was adjusted to 2:1, and xylene was used as a dispersing agent. The xylene dispersion solution of polymer-dispersed high-pure s-SWCNTs was obtained by ultrasonic dispersion and centrifugation.

2) The first powder was obtained by reference to general step 1.2.

3) The first powder obtained in step 2) was re-dispersed into dichloromechane solution of Neutral Red (NR) with a mass concentration of 0.01 mg/mL, and dichloromechane dispersion solution of high-pure s-SWCNTs with electrostatic repulsive force introduced between tubes was obtained.

4) The high-pure s-SWCNTs solid powder (i.e., second powder) with electrostatic repulsive force introduced between tubes and without free Neutral Red (NR) molecules was obtained by reference to general step 1.4.

5) The second powder obtained in step 4) was re-dispersed into a dichloromechane solvent to obtain chloroform dispersion solution of high-pure s-SWCNTs with electrostatic repulsive force introduced between tubes and without free Neutral Red (NR) molecules, wherein, the content of s-SWCNTs was 0.5 μg/mL or more, the mass ratio of s-SWCNTs to conjugated polymer was 1:0.01, and the mass ratio of s-SWCNTs to Neutral Red (NR) molecules was 1:0.05.

After the Neutral Red (NR) molecule itself, as a fluorescent molecule, was adsorbed onto the surface of high-pure s-SWCNTs through π-π stacking, its fluorescence can be quenched by s-SWCNTs, and correspondingly the fluorescence intensity was significantly reduced, as shown in FIG. 4B.

6) Referring to general step 2, the concentration of dichloromechane dispersion solution used for pulling was 3 μg/mL. Then deionized water was added onto the upper layer of the dispersion solution to form a water phase layer with a thickness of 2 mm. The silicon oxide wafer was inserted into dichloromechane dispersion solution at a descent rate ($v_1$) of 1500 μm/s, and then pulled out at an upward pulling rate ($v_2$) of 50 μm/s.

Figure 3B:
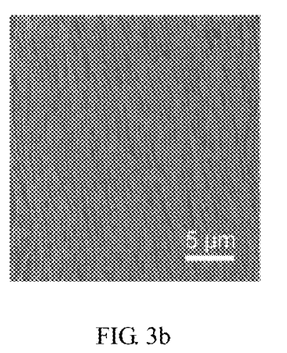
FIG. 3B is a SEM image of high-pure semiconductor type single-walled carbon nanotube aligned films obtained according to a typical embodiment 2 of the present application.

Through test, the SEM image of the semiconductor type single-walled carbon nanotube aligned film prepared in this example is shown in FIG. 3B, and the semiconductor type single-walled carbon nanotube presents large-area continuous alignment along the pulling direction of the base.

Example 3

1) On the basis of general step 1.1, referring to CN107456918A, a feed ratio of a three-dimensional three-shaped conjugated compound to a single-walled carbon nanotube raw material (commercially available and made by an arc discharge method) was adjusted to 3:1, and toluene was used as a dispersing agent. The toluene dispersion solution of polymer-dispersed high-pure s-SWCNTs was obtained by ultrasonic dispersion and centrifugation.

2) The first powder was obtained by reference to general step 1.2.

3) The first powder obtained in step 2) was re-dispersed into dichloromethane solution of Proflavine Hemisufate (PFS) with a mass concentration of 0.005 mg/mL, and dichloromechane dispersion solution of high-pure s-SWCNTs with electrostatic repulsive force introduced between tubes was obtained.

4) The high-pure s-SWCNTs solid powder (i.e. a second powder) with electrostatic repulsive force introduced between tubes and without free Proflavine Hemisufate (PFS) molecules was obtained by reference to general step 1.4.

5) The second powder obtained in step 4) was re-dispersed into a dichloromechane solvent to obtain chloroform dispersion solution of high-pure s-SWCNTs with electrostatic repulsive force introduced between tubes and without free Proflavine Hemisufate (PFS) molecules, wherein the content of s-SWCNTs was 0.5 μg/mL or more, the mass ratio of s-SWCNTs to conjugated polymer was 1:0.1, and the mass ratio of s-SWCNTs to Proflavine Hemisufate (PFS) molecules was 1:0.1.

6) Referring to general step 2, the concentration of dichloromechane dispersion solution used for pulling was 4 μg/mL. Then a mixed solution of deionized water and an inorganic salt was added onto the upper layer of the dispersion solution to form a water phase layer with a thickness of 5 mm. The hydrophobic base was inserted into dichloromechane dispersion solution at a descent rate ($v_1$) of 900 μm/s, and then pulled out at an upward pulling rate ($v_2$) of 100 μm/s.

Figure 3C:
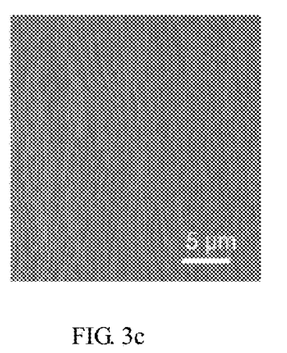
FIG. 3C is a SEM image of high-pure semiconductor type single-walled carbon nanotube aligned films obtained according to a typical embodiment 3 of the present application.

Through test, the SEM image of the semiconductor type single-walled carbon nanotube aligned film prepared in this example is shown in FIG. 3C, and the semiconductor type single-walled carbon nanotube presents large-area continuous alignment along the pulling direction of the base.

Example 4

1) On the basis of general step 1.1, referring to CN106823983A, a feed ratio of a three-dimensional three-shaped conjugated compound to a single-walled carbon nanotube raw material (commercially available and made by an arc discharge method) was adjusted to 1:2, and xylene was used as a dispersing agent. The xylene dispersion solution of polymer-dispersed high-pure s-SWCNTs was obtained by ultrasonic dispersion and centrifugation.

2) The first powder was obtained by reference to general step 1.2.

3) The first powder obtained in step 2) was re-dispersed into chloroform solution of Acridine Orange (AO) with a mass concentration of 0.02 mg/mL, and chloroform dispersion solution of high-pure s-SWCNTs with electrostatic repulsive force introduced between tubes was obtained.

4) The high-pure s-SWCNTs solid powder (i.e., second powder) with electrostatic repulsive force introduced between tubes and without free Acridine Orange (AO) molecules was obtained by reference to general step 1.4.

5) The second powder obtained in step 4) was re-dispersed into a chloroform solvent to obtain chloroform dispersion solution of high-pure s-SWCNTs with electrostatic repulsive force introduced between tubes and without free Acridine Orange (AO) molecules. Wherein, the content of s-SWCNTs was 0.5 µg/mL or more, the mass ratio of s-SWCNTs to conjugated polymer was 1:10, and the mass ratio of s-SWCNTs to Acridine Orange (AO) molecules was 1:10.

6) Referring to general step 2, the dispersion solution used for pulling was chloroform dispersion solution obtained in step 5) with a concentration of 6 µg/mL. Then deionized water was added onto the upper layer of the dispersion solution to form a water phase layer with a thickness of 15 mm. The descent rate ($v_1$) of the base was adjusted to 1200 µm/s, and the upward pulling rate ($v_2$) was adjusted to 300 µm/s.

Figure 3D:
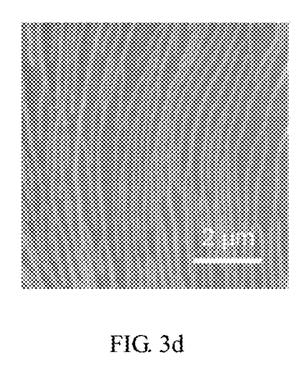
FIG. 3D is a SEM image of high-pure semiconductor type single-walled carbon nanotube aligned films obtained according to a typical embodiment 4 of the present application.

Through test, the SEM image of the semiconductor type single-walled carbon nanotube aligned film prepared in this example is shown in FIG. 3D.

Example 5

1) On the basis of general step 1.1, referring to CN106478927A, a feed ratio of a nonlinear conjugated polymer to a single-walled carbon nanotube raw material (commercially available and made by an arc discharge method) was adjusted to 10:1, and xylene was used as a dispersing agent. The xylene dispersion solution of polymer-dispersed high-pure s-SWCNTs was obtained by ultrasonic dispersion and centrifugation.

2) The first powder was obtained by reference to general step 1.2.

3) The first powder obtained in step 2) was re-dispersed into dichloromethane solution of Alizarin Red (AR) with a mass concentration of 0.05 mg/mL, and dichloromethane dispersion solution of high-pure s-SWCNTs with electrostatic repulsive force introduced between tubes was obtained.

4) The high-pure s-SWCNTs solid powder (i.e., second powder) with electrostatic repulsive force introduced between tubes and without free Alizarin Red (AR) molecules was obtained by reference to general step 1.4.

5) The second powder obtained in step 4) was re-dispersed into a chloroform solvent to obtain chloroform dispersion solution of high-pure s-SWCNTs with electrostatic repulsive force introduced between tubes and without free Alizarin Red (AR) molecules, wherein the content of s-SWCNTs was 0.5 µg/mL or more, the mass ratio of s-SWCNTs to conjugated polymer was 1:50, and the mass ratio of s-SWCNTs to Alizarin Red (AR) molecules was 1:20.

6) Referring to general step 2, the dispersion solution used for pulling was chloroform dispersion solution obtained in step 5) with a concentration of 10 µg/mL. Then deionized water was added onto the upper layer of the dispersion solution to form a water phase layer with a thickness of 10 mm. The descent rate ($v_1$) of the base was adjusted to 500 µm/s, and the upward pulling rate ($v_2$) was adjusted to 400 µm/s.

Figure 3E:
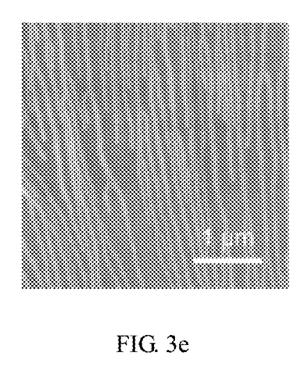
FIG. 3E is a SEM image of high-pure semiconductor type single-walled carbon nanotube aligned films obtained according to a typical embodiment 5 of the present application.

Through test, the SEM image of the semiconductor type single-walled carbon nanotube aligned film prepared in this example is shown in FIG. 3E.

Example 6

1) On the basis of general step 1.1, a feed ratio of a polyfluorene conjugated polymer (referring to CN101591219B) to a single-walled carbon nanotube raw material (commercially available and made by an arc discharge method) was adjusted to 5:1, and toluene was used as a dispersing agent. The toluene dispersion solution of polymer-dispersed high-pure s-SWCNTs was obtained by ultrasonic dispersion and centrifugation.

2) The first powder was obtained by reference to general step 1.2.

3) The first powder obtained in step 2) was re-dispersed into dichloromethane solution of Proflavine Hemisufate (PFS) with a mass concentration of 0.03 mg/mL, and dichloromethane dispersion solution of high-pure s-SWCNTs with electrostatic repulsive force introduced between tubes was obtained.

4) The high-pure s-SWCNTs solid powder (i.e., second powder) with electrostatic repulsive force introduced between tubes and without free Proflavine Hemisufate (PFS) molecules was obtained by reference to general step 1.4.

5) The second powder obtained in step 4) was re-dispersed into a dichloromethane solvent to obtain dichloromethane dispersion solution of high-pure s-SWCNTs with electrostatic repulsive force introduced between tubes and without free Proflavine Hemisufate (PFS) molecules, wherein the content of s-SWCNTs was 0.5 µg/mL or more, the mass ratio of s-SWCNTs to conjugated polymer was 1:100, and the mass ratio of s-SWCNTs to Proflavine Hemisufate (PFS) molecules was 1:50.

6) Referring to general step 2, the dispersion solution used for pulling was dichloromethane dispersion solution of s-SWCNTs obtained in step 5) with a concentration of 4.5 µg/mL. Then a mixed solution of deionized water and an organic solvent was added onto the upper layer of the dispersion solution to form a water phase layer with a thickness of 12 mm.

The descent rate ($v_1$) of the base was adjusted to 800 µm/s, and the upward pulling rate ($v_2$) was adjusted to 1000 µm/s.

Figure 3F:
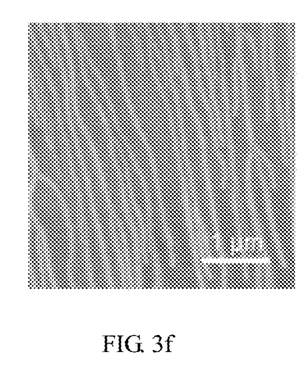
FIG. 3F is a SEM image of high-pure semiconductor type single-walled carbon nanotube aligned films obtained according to a typical embodiment 6 of the present application.
Figure 5A:
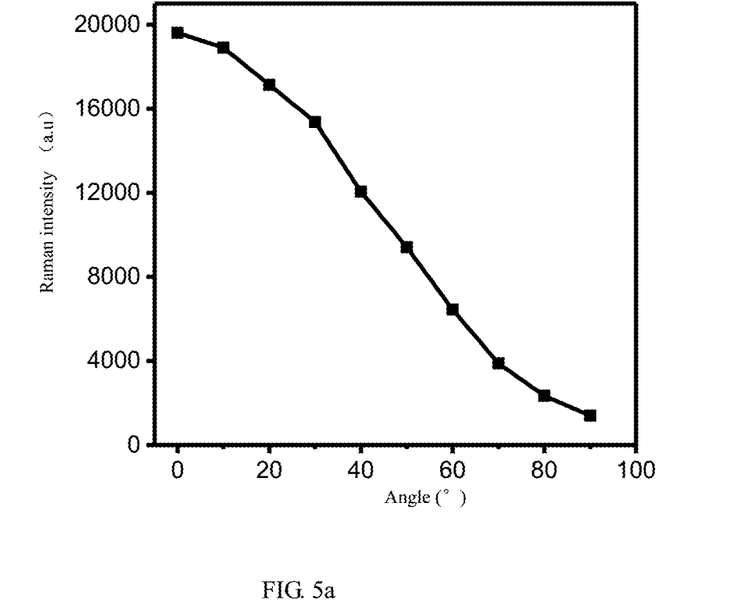
FIG. 5A is a polarization Raman spectrum indicating the alignment of a semiconductor type single-walled carbon nanotube film according to a typical embodiment 6 of the present application, which characterize alignment.
Figure 5B:
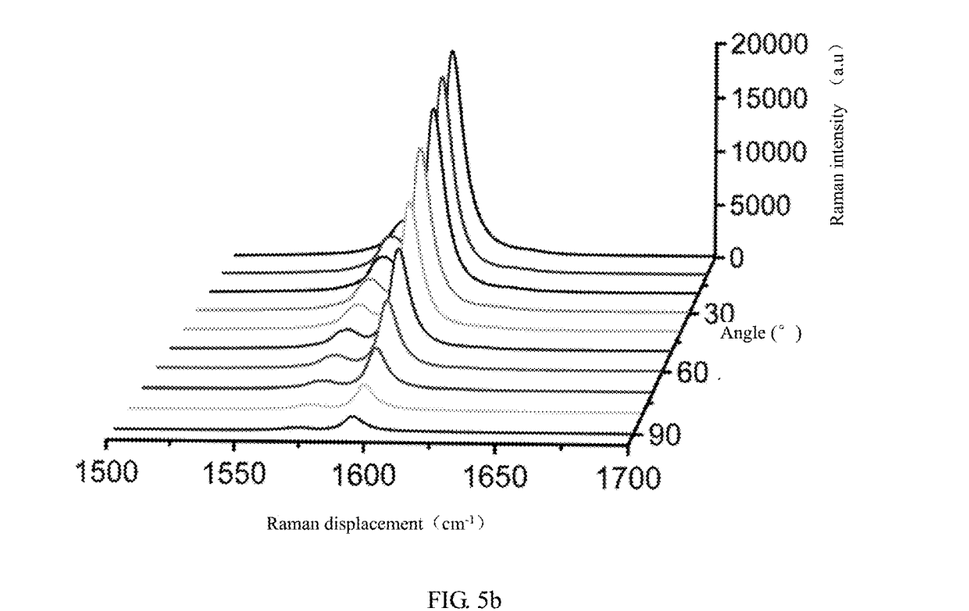
FIG. 5B is a polarization Raman spectrum indicating the alignment of a semiconductor type single-walled carbon nanotube film according to a typical embodiment 6 of the present application, which characterize alignment.

Through test, the SEM image of the semiconductor type single-walled carbon nanotube aligned film prepared in this example is shown in FIG. 3F, and the semiconductor type single-walled carbon nanotube presents large-area continuous alignment along the pulling direction of the base. The results are as shown in FIGS. 5A and 5B.

Example 7

1) On the basis of general step 1.1, a feed ratio of a polythiophene conjugated polymer to a single-walled carbon nanotube raw material (commercially available and made by an arc discharge method) was adjusted to 4:3, and xylene was used as a dispersing agent. The xylene dispersion solution of polymer-dispersed high-pure s-SWCNTs was obtained by ultrasonic dispersion and centrifugation.

2) The first powder was obtained by reference to general step 1.2.

3) The first powder obtained in step 2) was re-dispersed into chloroform solution of aromatic molecule Preyene+ with a mass concentration of 0.018 mg/mL, and chloroform dispersion solution of high-pure s-SWCNTs with electrostatic repulsive force introduced between tubes was obtained.

4) The high-pure s-SWCNTs solid powder (i.e., second powder) with electrostatic repulsive force introduced between tubes and without aromatic molecule Preyene+ was obtained by reference to general step 1.4.

5) The second powder obtained in step 4) was re-dispersed into dichlorobenzene to obtain dichlorobenzene dispersion solution of high-pure s-SWCNTs with electrostatic repulsive force introduced between tubes and without aromatic molecule Preyene+, wherein the content of s-SWCNTs was 0.5 µg/mL or more, the mass ratio of s-SWCNTs to conjugated polymer was 1:10, and the mass ratio of s-SWCNTs to aromatic molecule Preyene+ was 1:20.

6) Referring to general step 2, the dispersion solution used for pulling was dichlorbenzene dispersion solution obtained in step 5) with a concentration of 5.3 μg/mL. Then a mixed solution of deionized water and an organic solvent was added onto the upper layer of the dispersion solution to form a water phase layer with a thickness of 8 mm. The descent rate ($v_1$) of the base was adjusted to 1100 μm/s, and the upward pulling rate ($v_2$) was 500 μm/s.

Figure 3G:
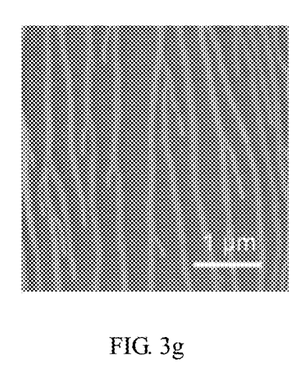
FIG. 3G is a SEM image of high-pure semiconductor type single-walled carbon nanotube aligned films obtained according to a typical embodiment 7 of the present application.

Through test, the SEM image of the semiconductor type single-walled carbon nanotube aligned film prepared in this example is shown in FIG. 3G Example 8

1) On the basis of general step 1.1, a feed ratio of a polyhenylene ethylene conjugated polymer to a single-walled carbon nanotube raw material (commercially available and made by an arc discharge method) was adjusted to 4:3, and xylene was used as a dispersing agent. The xylene dispersion solution of polymer-dispersed high-pure s-SWCNTs was obtained by ultrasonic dispersion and centrifugation.

2) The first powder was obtained by reference to general step 1.2.

3) The first powder obtained in step 2) was re-dispersed into chloroform solution of Orange G with a mass concentration of 0.018 mg/mL, and chloroform dispersion solution of high-pure s-SWCNTs with electrostatic repulsive force introduced between tubes was obtained.

4) The high-pure s-SWCNTs solid powder (i.e., second powder) with electrostatic repulsive force introduced between tubes and without orange G was obtained by reference to general step 1.4.

5) The second powder obtained in step 4) was re-dispersed into a dichloroethane solvent to obtain dichloroethane dispersion solution of high-pure s-SWCNTs with electrostatic repulsive force introduced between tubes and without Orange G, wherein the content of s-SWCNTs was 0.5 μg/mL or more, the mass ratio of s-SWCNTs to conjugated polymer was 1:10, and the mass ratio of s-SWCNTs to Orange G molecules was 1:20.

6) Referring to general step 2, the dispersion solution used for pulling was dichloroethane dispersion solution obtained in step 5) with a concentration of 5.5 μg/mL. Then a mixed solution of deionized water and an inorganic salt was added onto the upper layer of the dispersion solution to form a water phase layer with a thickness of 6 mm. The descent rate ($v_1$) of the base was adjusted to 200 μm/s, and the upward pulling rate ($v_2$) was 1 μm/s.

Figure 3H:
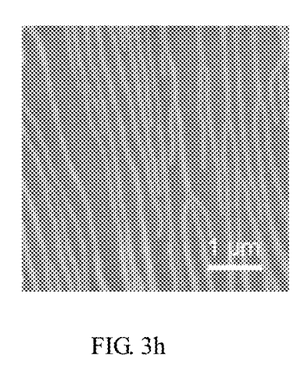
FIG. 3H is a SEM image of high-pure semiconductor type single-walled carbon nanotube aligned films obtained according to a typical embodiment 8 of the present application.

Through test, the SEM image of the semiconductor type single-walled carbon nanotube aligned film prepared in this example is shown in FIG. 3H.

Example 9

1) On the basis of general step 1.1, referring to CN105883749A, a feed ratio of a conjugated polymer having a warped structure on a main chain to a single-walled carbon nanotube raw material (commercially available and made by an arc discharge method) was adjusted to 4:3, and xylene was used as a dispersing agent. The xylene dispersion solution of polymer-dispersed high-pure s-SWCNTs was obtained by ultrasonic dispersion and centrifugation.

2) The first powder was obtained by reference to general step 1.2.

3) The first powder obtained in step 2) was re-dispersed into chloroform solution of Acridine Orange (AO) with a mass concentration of 0.018 mg/mL, and chloroform dispersion solution of high-pure s-SWCNTs with electrostatic repulsive force introduced between tubes was obtained.

4) The high-pure s-SWCNTs solid powder (i.e., second powder) with electrostatic repulsive force introduced between tubes and without Acridine Orange (AO) was obtained by reference to general step 1.4.

5) The second powder obtained in step 4) was re-dispersed into chlorobenzene to obtain chlorobenzene dispersion solution of high-pure s-SWCNTs with electrostatic repulsive force introduced between tubes and without Acridine Orange (AO) molecules, wherein the content of s-SWCNTs was 0.5 μg/mL or more, the mass ratio of s-SWCNTs to conjugated polymer was 1:0.1, and the mass ratio of s-SWCNTs to Acridine Orange (AO) molecules was 1:0.05.

6) Referring to general step 2, the dispersion used for pulling was chlorobenzene dispersion solution of s-SWCNTs obtained in step 5) with a concentration of 6.3 μg/mL. Then deionized water was added onto the upper layer of the dispersion solution to form a water phase layer with a thickness of 10 mm. The descent rate ($v_1$) of the base was adjusted to 2000 μm/s ($v_1$), and the upward pulling rate ($v_2$) was 5000 μm/s.

Figure 3I:
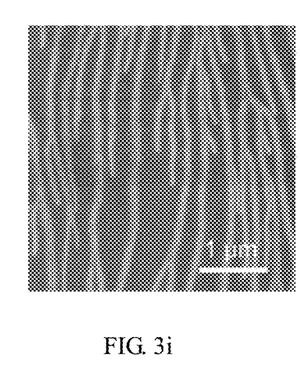
FIG. 3I is a SEM image of high-pure semiconductor type single-walled carbon nanotube aligned films obtained according to a typical embodiment 9 of the present application.

Through test, the SEM image of the semiconductor type single-walled carbon nanotube aligned film prepared in this example is shown in FIG. 3I.

In addition, the inventor of the present invention also conducts test by reference to manners in example 1-example 9 and using other raw materials and conditions listed in the specification, and prepares the carbon nanotube aligned film which is in consistency arrangement along the direction of pulling.

Using the semiconductor type single-walled carbon nanotube aligned film prepared by the above-mentioned examples of the present application are used to prepare electronic devices such as thin film transistors, field effect transistors, memories and integrated circuit devices, photoelectric devices such as photovoltaic devices and photodetectors, chemical sensors, biosensors and other sensor devices. The corresponding device preparation methods can be known in the industry. These devices exhibit improved optical and electrical properties, etc.

It should be noted that various technical feature of the above described examples can be arbitrarily combined. In order to make the description concise, all possible combinations of each technical feature in the above described examples are not described. However, as long as there is no contradiction in combinations of these technical features, they should be deemed as the scope of the description.

The above-mentioned examples only express several embodiments of the present application, and the descriptions are more specific and detailed, but cannot be understood as limiting the scope of the present application. It should be pointed out that for ordinary technical personnel in the art, several modifications and improvements can be made without departing from the concept of the present application, which fall within the protective scope of the present application. Therefore, the scope of protection of the patent application shall be based on the attached claims.

What is claimed is:

1. A carbon nanotube dispersion solution, comprising:
    a selected carbon nanotube;
    a polymer as a carbon nanotube dispersing agent, wherein the polymer binds to the selected carbon nanotube;
    an aromatic molecule, wherein the aromatic molecule binds to the selected carbon nanotube and allows a surface of the selected carbon nanotube to have same charges; and
    an organic solvent, wherein the organic solvent cooperates with components of the carbon nanotube dispersion solution to form a uniform dispersion solution.

2. The carbon nanotube dispersion solution according to claim 1, wherein the polymer comprises a homopolymer or a copolymer selected from at least one of polycarbazole, polyfluorene, polythiophene and polyphenylene ethylene, and a copolymerization unit of the copolymer comprises one selected from the group consisting of benzene, thiophene, pyridine, triarylamine, benzothiadiazole and one alkylated derivative of the benzene, the thiophene, the pyridine, the triarylamine and the benzothiadiazole; and/or, the selected carbon nanotube is a semiconductor type single-walled carbon nanotube; and/or, an average length of the selected carbon nanotube is 100-3000 nm.

3. The carbon nanotube dispersion solution according to claim 1, wherein a structural formula of the aromatic molecule comprises at least one of formula (I)-formula (V):

Formula (I)

Formula (II)

Formula (III)

Formula (IV)

Formula (V)

wherein, X comprises $SO_4^{2-}$, $SO_3^{2-}$, $CO_3^{2-}$, $NO_3^-$ or $Cl^-$, Y comprises Cl, and Z comprises $Na^+$ or $K^+$; wherein the aromatic molecule comprises one of the following compounds:

Formula (1)

Formula (2)

Formula (3)

Formula (4)

Pryene+

Formula (5)

Formula (6)

4. The carbon nanotube dispersion solution according to claim 1, wherein the organic solvent comprises at least one selected from the group consisting of a haloalkane, an aromatic hydrocarbon and an aryl halide; wherein the haloalkane comprises at least one selected from the group consisting of chloroform, dichloromethane and dichloroethane; wherein the aromatic hydrocarbon comprises toluene and/or xylene; wherein the aryl halide comprises chlorobenzene and/or dichlorobenzene; and/or, a content of the selected carbon nanotube in the carbon nanotube dispersion solution is at least 0.5 μg/mL; and/or, a mass ratio of the selected carbon nanotube to the polymer is 1:0.001-1:100; and/or, a mass ratio of the selected carbon nanotube to the aromatic molecule is 1:0.005-1:50.

5. A preparation method of the carbon nanotube dispersion solution according to claim 1, comprising:
   at least mixing a carbon nanotube powder raw material, the polymer as the carbon nanotube dispersing agent and a first solvent to form a first dispersion solution and specifically binding the polymer to the selected carbon nanotube, and then separating a first resulting carbon nanotube from the first dispersion solution, wherein a surface of the first resulting carbon nanotube binds to the polymer;
   at least mixing the first resulting carbon nanotube, the aromatic molecule and a second solvent to form a second dispersion solution and binding the aromatic molecule to the selected carbon nanotube and allowing the surface of the selected carbon nanotube to have the same charges, and then separating a second resulting carbon nanotube from the second dispersion solution, wherein a surface of the second resulting carbon nanotube binds to the polymer and the aromatic molecule; and
   dispersing the second resulting carbon nanotube into the organic solvent to form the carbon nanotube dispersion solution.

6. The preparation method according to claim 5, wherein the carbon nanotube powder raw material comprises a carbon nanotube powder prepared by an arc discharge method, a plasma discharge method, a laser ablation method or a chemical vapor deposition method.

7. A powder material, comprising:
   a selected carbon nanotube, a polymer as a carbon nanotube dispersing agent, wherein the polymer specifically binds to the selected carbon nanotube; and
   an aromatic molecule, wherein the aromatic molecular binds to the selected carbon nanotube and allows the selected carbon nanotube to have same charges;
   wherein a structural formula of the aromatic molecule comprises at least one of formula (I)-formula (V):

Formula (I)

Formula (II)

Formula (III)

Formula (IV)

Formula (V)

wherein, X comprises $SO_4^{2-}$, $SO_3^{2-}$, $CO_3^{2-}$, $NO_3^-$ or $Cl^-$, Y comprises Cl, and Z comprises $Na^+$ or $K^+$; wherein the aromatic molecule comprises any one of the following compounds:

Formula (1)

Formula (2)

Formula (3)

Formula (4)

Pryene+

Formula (5)

Formula (6)

8. The powder material according to claim 7, wherein the polymer comprises a homopolymer or a copolymer of at least one of polycarbazole, polyfluorene, polythiophene and polyphenylene ethylene, wherein a copolymerization unit of the copolymer is at least one selected from the group consisting of benzene, thiophene, pyridine, triarylamine and benzothiadiazole, and/or one alkylated derivative of the benzene, the thiophene, the pyridine, the triarylamine and the benzothiadiazole; and/or, the selected carbon nanotube is a semiconductor type single-walled carbon nanotube; and/or, a mass ratio of the selected carbon nanotube to the polymer in the powder material is 1:0.001-1:100; and/or, a mass ratio of the selected carbon nanotube to the aromatic molecule in the powder material is 1:0.005-1:50; and/or, an average length of the selected carbon nanotube is 100-3000 nm.

9. A preparation method of a carbon nanotube aligned film, comprising:
providing the carbon nanotube dispersion solution according to claim 1, wherein the carbon nanotube dispersion solution is immiscible with water;
taking the carbon nanotube dispersion solution as an organic phase layer, and introducing a water phase layer on the organic phase layer to form a double-layer liquid phase system, wherein the double-layer liquid phase system is composed of the water phase layer and the organic phase layer; and
partially or completely inserting a base into the double-layer liquid phase system, and then pulling out the base from the double-layer liquid phase system to form the carbon nanotube aligned film on a surface of the base.

10. The preparation method according to claim 9, comprising: inserting the base into the double-layer liquid phase system at a speed of 200-2000 μm/s; and/or, pulling out the base from the double-layer liquid phase system at a pulling speed of 1-5000 μm/s.

11. The preparation method according to claim 9, wherein the water phase layer comprises pure water or an aqueous solution; wherein the aqueous solution also contains inorganic salts and/or organic solvents.

12. The preparation method according to claim 9, wherein a material of the base comprises a rigid material and/or a flexible material; wherein the rigid material comprises an oxidized silicon wafer, a quartz plate or a sapphire substrate; wherein the flexible material comprises polyethylene naphthalate, polyethylene terephthalate or polyimide.

13. A carbon nanotube aligned film prepared by the preparation method according to claim 9.

14. A method of preparing electronic devices, photoelectric devices or sensor devices, comprising the step of using the carbon nanotube aligned film according to claim 13 in a preparation of the electronic devices, the photoelectric devices or the sensor devices.

15. An apparatus, comprising the carbon nanotube aligned film according to claim 13; wherein the apparatus comprises an electronic device, a photoelectric device or a sensor device; wherein the electronic device comprises a thin film transistor, a field effect transistor, a memory or an integrated circuit device; the photoelectric device comprises a photovoltaic device or a photoelectric detector; and the sensor device comprises a chemical sensor or a biological sensor.

16. The carbon nanotube aligned film according to claim 13, wherein the preparation method comprises inserting the base into the double-layer liquid phase system at a speed of 200-2000 μm/s; and/or, pulling out the base from the double-layer liquid phase system at a pulling speed of 1-5000 μm/s.

17. The carbon nanotube aligned film according to claim 13, wherein the water phase layer comprises pure water or an aqueous solution; wherein the aqueous solution also contains inorganic salts and/or organic solvents.

* * * * *